US008278561B2

(12) United States Patent
Kamata et al.

(10) Patent No.: US 8,278,561 B2
(45) Date of Patent: Oct. 2, 2012

(54) CONDUCTIVE PATTERN FORMING FILM, AND CONDUCTIVE PATTERN FORMING METHOD AND CONDUCTIVE PATTERN FORMING APPARATUS FOR THE CONDUCTIVE PATTERN FORMING FILM

(75) Inventors: Toshihide Kamata, Tsukuba (JP); Manabu Yoshida, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 570 days.

(21) Appl. No.: 12/443,482

(22) PCT Filed: Oct. 17, 2007

(86) PCT No.: PCT/JP2007/070230
§ 371 (c)(1),
(2), (4) Date: Mar. 29, 2009

(87) PCT Pub. No.: WO2008/047823
PCT Pub. Date: Apr. 24, 2008

(65) Prior Publication Data
US 2010/0025088 A1    Feb. 4, 2010

(30) Foreign Application Priority Data

Oct. 19, 2006   (JP) .................................. 2006-284445
Oct. 15, 2007   (JP) .................................. 2007-268168

(51) Int. Cl.
*H05K 1/09* (2006.01)
*H05K 1/00* (2006.01)
*H05K 1/03* (2006.01)
*H05K 1/02* (2006.01)
(52) U.S. Cl. ......... 174/257; 174/250; 174/256; 174/259
(58) Field of Classification Search ................ 174/256, 174/257, 259, 250
See application file for complete search history.

(56) References Cited

U.S. PATENT DOCUMENTS

| 4,744,850 | A  | * | 5/1988  | Imano et al. ............... 156/265 |
| 5,174,925 | A  | * | 12/1992 | Fujii et al. ................. 252/514 |
| 5,197,655 | A  |   | 3/1993  | Leerssen et al. |
| 5,332,869 | A  | * | 7/1994  | Hagiwara ................... 174/257 |
| 6,034,331 | A  | * | 3/2000  | Tsukagoshi et al. ........ 174/250 |
| 6,238,597 | B1 | * | 5/2001  | Yim et al. ................. 252/512 |
| 6,365,840 | B1 | * | 4/2002  | Honda et al. ............... 174/259 |
| 6,372,158 | B1 | * | 4/2002  | Hashimoto et al. ........ 252/514 |
| 6,376,050 | B1 | * | 4/2002  | Terasaki et al. ............ 428/209 |
| 2003/0051801 | A1 |   | 3/2003  | Usami et al. |
| 2003/0213614 | A1 | * | 11/2003 | Furusawa et al. .......... 174/256 |
| 2004/0091803 | A1 | * | 5/2004  | Yamazaki et al. ......... 430/108.1 |
| 2005/0153107 | A1 | * | 7/2005  | Iijima ....................... 428/195.1 |

(Continued)

FOREIGN PATENT DOCUMENTS

EP   0501358 A2   9/1992
GB    869295 A    5/1961

(Continued)

*Primary Examiner* — Timothy Thompson
*Assistant Examiner* — Sherman Ng
(74) *Attorney, Agent, or Firm* — Law Office of Katsuhiro Arai (57) ABSTRACT

A conductive pattern forming film provides a pattern formed on a film substrate having flexibility by pressurizing, under heating, a conductive paste in which powder or fine particles of metal or semiconductor are dispersed and filled. A conductive pattern forming apparatus comprises a sample installation table having a flat placement surface, and a driving body for pressure application which is placed in a manner facing the placement surface and movable, wherein the driving body for pressure application is equipped with a support which is constituted by a flat metal panel having metal spheres along its bottom face.

10 Claims, 9 Drawing Sheets

U.S. PATENT DOCUMENTS

| | | | |
|---|---|---|---|
| 2006/0100314 A1* | 5/2006 | Arifuku et al. | 523/210 |
| 2009/0107707 A1* | 4/2009 | Yamakawa et al. | 174/257 |

FOREIGN PATENT DOCUMENTS

| | | |
|---|---|---|
| JP | 2001-64547 A1 | 3/2001 |
| JP | 2001-243836 A1 | 9/2001 |
| JP | 2004-273205 A1 | 9/2004 |
| JP | 2005-259848 A1 | 9/2005 |
| JP | 2006-24485 A1 | 1/2006 |
| JP | 2006-517606 A1 | 7/2006 |
| WO | 2004-067647 A1 | 8/2004 |

* cited by examiner

CONDUCTIVE PATTERN FORMING FILM, AND CONDUCTIVE PATTERN FORMING METHOD AND CONDUCTIVE PATTERN FORMING APPARATUS FOR THE CONDUCTIVE PATTERN FORMING FILM

This application is the U.S. National Phase under 35 U.S.C. §371 of International Application PCT/JP2007/070230, filed on Oct. 17, 2007, which claims priority to Japanese Patent Application No. 2006-284445, filed on Oct. 19, 2006, and No. 2007-268168, filed on Oct. 15, 2007. The International Application was published under PCT Article 21(2) in a language other than English.

TECHNICAL FIELD

The present invention relates to a conductive pattern forming film that allows for manufacturing of flexible electronic devices at low cost, as well as a method for forming conductive pattern and a conductive pattern forming apparatus for the same, and particularly to a method and apparatus for forming a conductive pattern on a film substrate having flexibility at low temperature and with ease.

PRIOR ART

In recent years, there have been expectations that flexible sheet displays, flexible RF-ID (radio frequency identification) systems and other user-friendly electronic devices will become rapidly popular. To make this a reality, electronic device patterns must be formed on flexible plastic films. Application of a printing process is being considered as a means for forming these electronic device patterns in large volumes at low cost.

Traditionally, the mainstream method for forming fine wiring patterns has been to apply patterning under the photo-lithography method on a thin metal film that has been formed according to the heat deposition method or sputtering method. However, a vacuum environment is an essential requirement of the heat deposition method and sputtering method, and thus reducing the process cost has been difficult. Also, the photo-lithography method requires a large amount of solvent, which is pointed out as a negative impact on the environment.

Wiring technology using printing allows for manufacturing of products in large volumes at low cost and high speed, and therefore this technology is already in use in the practical applications for electronic device manufacturing. However, in order to form a wiring of high electrical conductivity using printing, baking at high temperature has been a must to remove binder component and other undesirable contents from the formed conductive ink pattern (refer to Patent Literature 1).

On the other hand, many flexible plastic films soften and melt at high temperatures, and it is therefore difficult to implement printed devices on plastic films. Accordingly, in most cases printed devices are currently implemented on glass and other heat-resistant hard substrates.

Technologies are already available to form wiring patterns having electrical conductivity at relatively low temperatures, such as one whereby ink in which metal nano-particles are dispersed is coated using the inkjet method, etc. (refer to Patent Literatures 2 to 4). However, metal nano-particles are expensive and therefore it is difficult, with metal nano-particles, to achieve the purpose of manufacturing products in large volumes at low cost.

Patent Literature 1: Japanese Patent Laid-open No. 2001-243836
Patent Literature 2: Japanese Patent Laid-open No. 2005-259848
Patent Literature 3: Japanese Patent Laid-open No. 2004-273205
Patent Literature 4: Japanese Translation of PCT International Patent Application No. 2006-517606

SUMMARY OF THE INVENTION

Problems to Be Solved By the Invention

It is the object of the present invention to form a conductive pattern using a simple process on a general plastic substrate having flexibility, and also to provide a conductive pattern forming film that allows for easy formation of a conductive pattern using an apparatus that performs a simple process of oriented pressurization at low temperature, as well as a method for forming conductive pattern and a conductive pattern forming apparatus for the same.

Means for Solving the Problems

In order to achieve the aforementioned object, the present invention adopts the specific solutions explained below.

The conductive pattern forming film provides a pattern formed on a film substrate having flexibility by pressurizing, under heating, a material constituted by conductive fine particles that are dispersed and filled in a viscous substance.

The conductive fine particles are fine metal or semiconductor particles. Also, the conductive fine particles are gathered or aggregated into a powder form.

The powder particle does not have an isotropic shape, but the lengths of its long axis and short axis are different, where the long axis of each powder particle is oriented in parallel with the substrate surface and contacting the adjacent powder particles.

The conductive fine particles or conductive fine particles that constitute powder contain one or more materials selected arbitrarily from silver, gold, copper and aluminum, or aluminum in which additive particles are mixed.

The additive particles are zinc particles.

The fine semiconductor particles constituting the conductive fine particles or conductive fine particles that form powder are any one or more materials selected arbitrarily from zinc oxide, indium oxide, titanium oxide, tin oxide, nickel oxide and compounds that contain any of the foregoing.

The viscous substance is a conductive paste containing a viscous substance, where the density change of viscous substance in the direction vertical to the substrate surface has a slope which is higher near the surface that contacts the substrate than near the surface on the opposite side of the surface that contacts the substrate.

The film substrate is resistant to the solvents contained in the viscous substance, has a glass transition point which is equal to or higher than the boiling points of these solvents, adheres favorably with the viscous substance, and also has electrical insulation property and low dielectric constant. For example, PET film is used as the substrate.

The surface smoothness of the pattern is 0.2 μm or less in arithmetic roughness (Ra) based on a roughness curve obtained from an optical microscope image of section over a calculation width of 100 μm.

The conductive pattern forming apparatus comprises a sample installation table having a flat placement surface and structured in a manner movable in the horizontal direction, and a driving body for pressure application which is positioned in a manner facing the placement surface and movable at an arbitrary speed, where the driving body for pressure application faces the placement surface and also has a curved or spherical surface that contacts the sample.

The driving body for pressure application is constituted by a flat metal plate on which metal spheres are provided along the bottom face.

The metal spheres have an arbitrary diameter in a range of 0.1 mm to 5 mm.

The driving body for pressure application is structured in such a way that it moves in the direction vertical to the sample installation table to apply pressure, while in the horizontal direction it is driven at a different speed from the moving speed of the sample, so that pressure is applied in both the vertical direction and horizontal direction.

On the driving body for pressure application, one row of a plurality of metal spheres is provided on the sample installation table side of the flat metal plate.

The flat metal plate has a magnet to attract and retain the metal spheres through the flat metal plate.

Also, a mesh sheet can be provided between the driving body for pressure application and the sample, so as to apply pressure through the mesh sheet.

The driving body for pressure application is provided in a plurality in parallel with the flat placement surface of the sample installation table, where all driving bodies are also arranged in parallel with one another, in order to apply pressure on the sample, placed on the placement surface, multiple times consecutively using the plurality of driving bodies provided in parallel.

The control unit provided on the sample installation table is designed so that it can control the heating temperature of the sample installation table independently of the heating temperature of the driving body for pressure application, by using heating means provided in the sample installation table and driving body for pressure application, respectively. Also, means for measuring the pattern resistivity can also be provided.

The space between the driving body for pressure application and the pattern is heated locally by supplying electrical current.

The conductive pattern forming apparatus is an apparatus that lowers the resistivity of the formed pattern by applying onto a film substrate having flexibility a material constituted by fine metal or semiconductor particles dispersed in a viscous substance, wherein such apparatus comprises a sample installation table having a smooth surface on which a pattern-coated film substrate is placed with the pattern-coated side facing up, and a driving body for pressure application which is placed above the sample installation table and has projections on the surface which is facing and in parallel with the sample installation table, where the driving body for pressure application is pressure-contacted against the film placed on the flat surface of the heated sample installation table, from the direction vertical to the film surface, while the driving body for pressure application is also traveled in an arbitrary direction in parallel with the film surface to apply the sliding stress generated by such traveling, in order to improve the electrical conductivity of the coated pattern formed on the film.

The heating temperature is equal to or higher than the boiling temperatures of solvents contained in the conductive paste or viscous substance, and also equal to or lower than the glass transition point of the plastic substrate.

The applied pressure is set in such a way that the pressure applied to one contact point between a metal sphere and the pattern is in a range of 0.1 MPa to 100 MPa.

The control unit implements control over temperature of the heating and pressure of the pressurization in such a way that the pattern deformation ratio before and after the heating and pressurization is within ±1% in the direction of flat surface, or within ±10% in the direction of film thickness.

The present invention is characterized by an apparatus that can form a conductive pattern of high electrical conductivity by means of pressurization under temperature control, where the formed pattern is a pattern on plastic film formed by fine metal or semiconductor particles uniformly dispersed in a viscous elastic medium, or a pattern on plastic film formed by fine metal or semiconductor particles that have been adsorbed and fixed onto a viscous substance.

Effects of the Invention

According to the present invention, by using a manufacturing apparatus of simple structure, a conductive pattern can be formed on a substrate at low temperature with a simple operation with ease.

Even when a general conductive printing ink is used, a wiring pattern of high electrical conductivity or high-performance thin semiconductor film can still be formed on a flexible substrate at low temperature.

Also, a conductive pattern forming film as well as a method for forming conductive pattern and a conductive pattern forming apparatus for the same, all according to the present invention, allow for easy formation of a highly electrically conductive pattern by using an apparatus that implements a simple pressurization process at low temperature, in order to form conductive patterns in large volumes at low cost on general plastic substrates having flexibility.

Since it uses a low-temperature baking technology involving 150° C. or below, the present invention can also be applied to plastics whose processing temperature is relatively low.

In addition, the present invention is also applicable to semiconductor pastes, which means that an active element can be formed on a film having flexibility using a low-temperature coating process.

According to the present invention, it is also possible to form, on a film having flexibility, metal electrodes having various work functions. Accordingly, the present invention can be applied to flexible batteries, electro-chromic display elements, electro-luminescence elements, diode elements, etc.

DESCRIPTION OF THE SYMBOLS

1 Flat metal plate
2 Magnet
3 Frame
10 Driving body for pressure application
20 Metal sphere
30 Sample installation table
40 Fine particle pattern
50 Flexible substrate
60 Resin binder
70 Fine metal/semiconductor particle
80 Silver ink for screen printing
90 Antenna wiring pattern
100 Antenna substrate
100 Electric field effect transistor substrate
110 PVA adhesion layer
120 ZnO
130 Gate insulation film
140 Drain-source electrode
150 Gate electrode

BEST MODE FOR CARRYING OUT THE INVENTION

The present invention is explained in detail based on the drawings.

In the following explanations, each term is used in the specified meaning. To be specific, the fine particles refer to fine solid particles or particles that are dispersed individually in gas or exhaust gas released from a smoke stack, etc., while the powder normally refers to a loosely gathered or aggregated form of small solid particles.

The conductive fine particles include fine metal particles and fine semiconductor particles. The fine metal particles constitute a powder of fine semiconductor particles (loosely gathered or aggregated form of fine particles). The fine semiconductor particles constitute a powder of fine semiconductor particles (loosely gathered or aggregated form of fine particles).

The viscous substance must satisfy certain conditions, such as being also a resin binder, capable of forming a pattern via printing or under the dispensing method or inkjet method, not degrading the substrate, and not having negative impact on electrical properties of the conductive pattern after heating. Materials that can be used favorably as the viscous substance include aqueous solution of polyvinyl alcohol (PVA), polystyrene (PS) toluene solution, polymethyl methacrylate (PMMA) toluene solution, and other substances constituting a conductive paste, insulation paste or other paste after removal of conductive substances from the paste.

In other words, the conductive paste refers to a substance comprising a mixture of viscous substance and conductive substance.

The film on which a conductive pattern is formed is made by applying on a substrate in a specified pattern shape a paste constituted by fine particles or powder particles of metal or semiconductor material that are dispersed and filled in a viscous substance.

The aforementioned pressurization control includes heating and pressurization processes. As for oriented pressurization, which is a type of pressurization, sliding stress is generated in the sample by the following means: (1) metal spheres, etc., are used, so that the pressurization surface is not a flat surface, but it is a surface with R, and (2) a difference is provided between the feed speeds of the sample installation table and metal spheres which are sandwiching the sample. Temperature control is also implemented at the same time. This control is implemented in such a way that the heater temperature $T_R$ and substrate temperature $T_S$ can be adjusted independently and "$T_R > T_S$" is satisfied.

An electromagnetic heating means, such as infrared light, etc., can also be used for this heating. If an electromagnetic heating means is used, quick heating and quick cooling become possible.

The pressurization means may be a multi-point pressurization means including a pressurization means using multiple fine spheres. If a multi-point pressurization based on net pressurization is used, it is amply possible to adopt an excitation heating means whereby heating is implemented by supplying electrical current while the resistivity is measured at the same time.

The following means are available for applying pressure to the sample:
(1) Roller type
   Two pressures, applied in the vertical direction and moving direction, are utilized.
(2) Blade type
   The area at the tip of pressurization is minimized to improve the pressure application efficiency and thereby enable application of high pressure even when a small machine is used.
(3) Fine sphere type
   Three pressures, applied in the directions of three axes of X, Y and Z, are utilized.

Conductive ink, which is a type of conductive paste, may be of separation type or dispersion type according to the behavior of conductors. Dispersion-type conductive ink constitutes a conductive material, semiconductor material or electrode material according to the final content of conductors. Various electronic devices can be made according to those embodiments.

The conditions for ink include the following:
(1) It must contain a binder.
(2) It must be constituted by a mixture of sheet-type ink whose long axis and short axis have different lengths, and particle-type ink, because such mixture is sometimes proven effective.
(3) Contained solvents must volatilize at low temperatures (100° C. or below) to lower the processing temperature.
(4) It must also be effectively usable for conductive powder attachment patterns on binders, in order to eliminate the need for developing new ink.

When forming a wiring pattern, gold, silver, copper, aluminum and carbon can be used. Although the types of applicable semiconductor materials are not limited in any way, generally ZnO, $SnO_2$, $In_2O_3$ and NiO can be used. Electrode materials shall be used by adjusting their work function according to the applicable mixture of the aforementioned materials.

Also in the oriented paste, the distribution of the angle formed by the long axis of the powder and the direction of flat substrate surface is generally 20 degrees or less on average, while the distribution band (standard deviation) is 20 degrees or less. To increase the contact area between fine particles and lower the contact resistivity, however, it is desirable for the angle distribution to be kept to 15 degrees or less on average and the distribution band (standard deviation), to 15 degrees or less.

In the pattern coated on the substrate using a paste of fine metal or semiconductor particles or powder particles, the viscous substance that was used to disperse these fine particles or powder particles still remains. Accordingly, the density of this viscous substance must have a slope which is higher near the surface that contacts the substrate than near the surface opposite the substrate (surface on the opposite side of the surface that contacts the substrate).

The ratio of the density of viscous substance near the surface that contacts the substrate, to the density of viscous substance near the surface opposite the substrate, should desirably be in a range of 2:1 to 10:1 in order to assure sufficient adhesive strength and also keep the resistivity low.

As for the pattern coated on the substrate using a fine metal or semiconductor particles or powder particles, desirably "the smaller, the better" for the arithmetic roughness (Ra) indicating the smoothness of its surface (roughness curve obtained from an optical microscope image of section over a calculation area of 100 µm), in order to maintain continuity of the film above it when a new film is laminated onto the pattern.

As for the film on which a conductive pattern is formed, its material is not limited in any way as long as it is a plastic film. However, use of PET film is desirable from the viewpoints of cost, mechanical strength and heat resistivity. As long as it is made of a polyester derivative, PET film can have any properties such as substitution group, polymerization level, purity, size, thickness, density, surface treatment method, stretching method, color, and transparency.

The necessary conditions for any plastic film that can be used on a film substrate under the present invention are as follows: the film must be resistant to the solvents contained in the conductive paste or viscous substance; the film must have a glass transition point (softening point) which is equal to or higher than the boiling points of these solvents; the film must adhere favorably with the conductive paste or viscous substance; and the film must have electrical insulation property and low dielectric constant ($\in$=2.0 to 3.0). Materials that can be used favorably in general include polyimide (PI), polyethylene terephthalate (PET), polyethylene naphthalate (PEN), polyether sulfone (PES), polystyrene (PS), polymethyl methacrylate (PMMA), polycarbonate (PC), polyamide (PA), polypropylene (PP), polyphenylene oxide (PPO) and crystal polymer film. When these plastics are used, they may sometimes be given chemical treatment or physical treatment on their surface for the purpose of improving adhesion.

If the fine particles or powder particles of metal or semiconductor, which are dispersed in the viscous substance, have multiple different shapes, then at least one type of these different particles shall have different lengths for its long axis and short axis and at least one other type of these different particles shall be spherical, from the viewpoints of achieving sufficient pressure orientation effect and enhancing the contact probability among particles.

The diameters of fine particles or powder particles of metal or semiconductor dispersed in the viscous substance must be large enough not to be affected by the quantum sizing effect, but also small enough to ensure a printing resolution of approx. 10 µm. Accordingly, the diameter shall desirably be in a range of 10 nm to 10 µm.

Although the type of metal dispersed in the viscous substance is not limited in any way, it is generally desirable to use silver, gold, copper or aluminum alone, carbon, or any alloy that contains at least one of the foregoing.

If the metal dispersed in the viscous substance is aluminum, it is effective to mix additive particles in the viscous substance.

To ensure sufficient electronic properties at aluminum surface, the concentration of additive particles should desirably be lower. However, the concentration must be enough to demonstrate the contact-resistivity reducing effect of additive particles. Accordingly, additive particles should desirably be added to 20 wt % or more, but 50 wt % or less, relative to aluminum.

Additive particles mixed into the aluminum paste should desirably be zinc particles that have a work function relatively close to that of aluminum and are less vulnerable to the effect of oxides at particle surface.

The conductive pattern forming apparatus comprises a sample installation table having a smooth surface and movable in the horizontal direction, and a driving body for pressure application which is placed in a manner facing the installation surface and movable, where it is desirable that the sample installation table and driving body for pressure application be movable independently at arbitrary speeds and that the driving body for pressure application have a curved or spherical surface that contacts the sample.

The driving body for pressure application should desirably have a support in its pressure application part where such support is constituted by a flat metal plate having metal spheres provided along its bottom face.

As for the metal spheres, the higher their contact density with the sample, the higher the uniformity of flat surface becomes after the processing. At the same time, however, it is better to have fewer contacts in order to concentrate pressure. Accordingly, the metal spheres should desirably have an arbitrary diameter in a range of 0.1 mm to 5 mm.

The driving body for pressure application is driven in the horizontal direction toward the sample installation table at a speed different from the moving speed of the sample, and also simultaneously when pressure is applied in the vertical direction, in order to apply pressures in both the vertical direction and horizontal direction.

The driving body for pressure application should ideally have one row of a plurality of metal spheres contacting the sample installation table side of the flat metal plate.

The metal spheres are attracted and retained onto the support by means of the magnet provided on the opposite side of the flat metal plate from the metal spheres.

Also, a mesh sheet can be provided between the driving body for pressure application and the sample, so as to apply pressure through the mesh sheet.

As for the mesh sheet, its material and fineness of mesh are not specifically limited. However, it is desirable to use a stainless fine mesh sheet from the viewpoint of pressurization efficiency.

A plurality of the driving bodies for pressure application are installed in parallel to allow for multiple, consecutive applications of pressure.

The number of driving bodies for pressure application, diameter of each driving body, and radius of curvature of its contact part, are not limited in any way, and all driving bodies for pressure application may be made of the same material or different materials. Each driving body may also have a different function.

The heating temperature of the sample installation table can be controlled independently from the heating temperature of the driving body for pressure application.

An infrared lamp can also be used to heat the pressure application head.

It is possible to adjust pressure by placing a heavy stone on the head. In addition, electrical current may be supplied between the fine spheres contacting the sample, in order to monitor the pattern resistivity.

Needless to say, the fine spheres that are used to pressure the sample can be attracted and retained using magnets.

It is also possible to provide means for measuring pattern resistivity in the pressure application process using the driving body for pressure application.

The space between the driving body for pressure application and the pattern can also be heated locally by supplying electrical current.

Example 1

Figure 1:
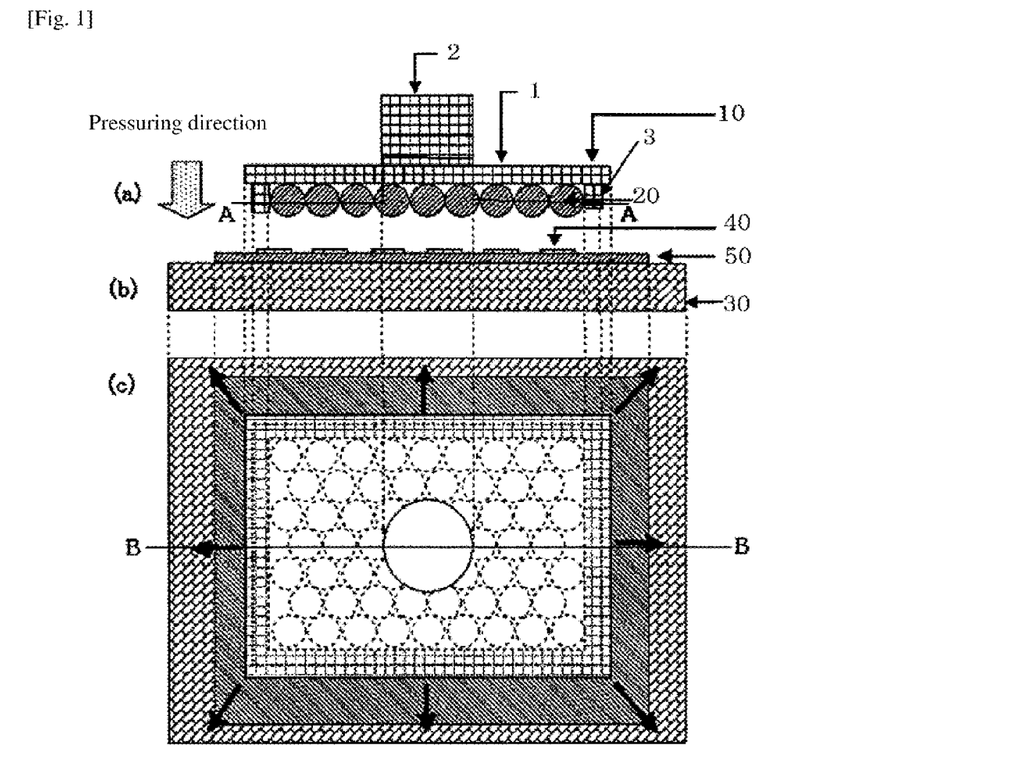
FIG. 1 Schematic drawing of a conductive pattern forming apparatus conforming to the present invention.

A conductive pattern forming apparatus according to the present invention comprises a driving body for pressure application 10 and a sample installation table 30, as shown in FIG. 1. In FIG. 1, FIG. 1(a) is a section view of the driving body for pressure application (section B-B of FIG. 1(c)), FIG. 1(b) is a section view of the sample installation table (section B-B of FIG. 1(c)), and FIG. 1(c) is a top view of section A-A of FIG. 1(a) when the section is rotated around the center axis. The driving body for pressure application 10 is structured in such a way that it has a column-shaped magnet 2 on the top face of a flat metal plate 1, and a rectangular frame 3 is provided below this flat metal plate 1, with a plurality of metal spheres 20 arranged, without any gap left in between, in a single row along the bottom face of the flat metal plate 1 inside this rectangular frame 3. The metal spheres 20 are attracted to the flat metal plate 1 by the magnet 2. The metal spheres 20 used in the present invention are made of iron, carbon steel or stainless (SUS410 or SUS430) in order to ensure both sufficient magnetization property and strength. The metal spheres 20 have a diameter of 0.1 mm to 5.0 mm, and the pressure applied at each contact point at the time of pressurization is adjusted to a range of 0.1 MPa to 100 MPa. The sample installation table 30 comprises a rectangular flat metal plate. The temperature of the sample installation table 30 is adjustable.

The driving body for pressure application 10 and sample installation table 30 constitute the conductive pattern forming apparatus.

The sample, which is a flexible substrate 50, is made of any general plastic substrate having flexibility, such as plastic film.

A fine particle pattern 40 is coated on the flexible substrate (by means of a coating means) by adsorbing and fixing powder or fine particles of metal or semiconductor onto the surface of a viscous substance, or by dispersing powder or fine particles of metal or semiconductor in a viscous substance.

When the apparatus is driven, the driving body for pressure application 10 is used to pressurize under heating the metal spheres 20 vertically to the substrate surface, and against the fine particle pattern 40 in which fine metal or semiconductor particles are dispersed, or against the fine particle pattern 40 which is formed by fine metal or semiconductor particles adsorbed and fixed onto a viscous substance, where each pattern is coated on a flexible substrate, while at the same time the driving body for pressure application 10 is traveled in an arbitrary direction along the substrate surface within the fine particle pattern 40 to apply sliding stress, and thereby pressure the entire surface of the fine particle pattern 40 efficiently, in order to form a conductive pattern having high electrical conductivity and high electrical characteristics.

Figure 2:
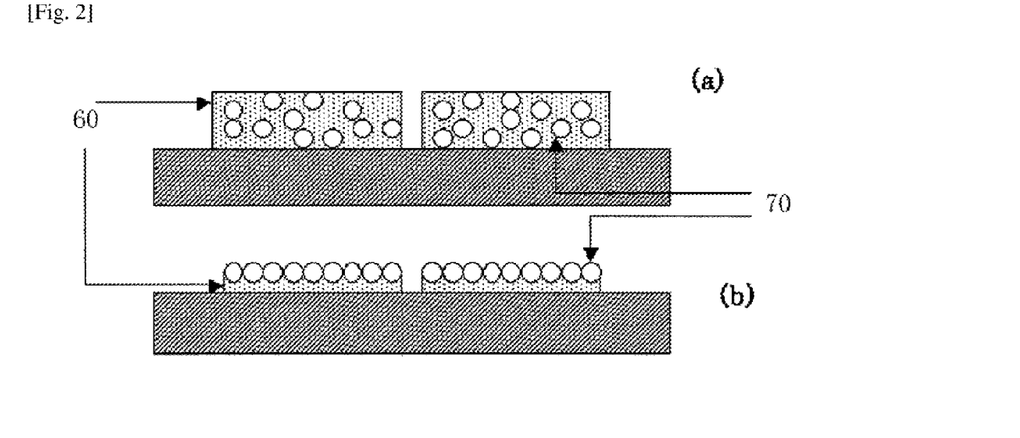
FIG. 2 Schematic drawing of a fine particle pattern conforming to the present invention.

After this process, the fine particle pattern 40 changes from the initial condition shown in FIG. 2 (a) to the processed condition shown in FIG. 2 (b).

This fine particle pattern is constituted by powder and fine particles of metal or semiconductor 70 which are dispersed in a resin binder 60 which is a viscous substance. FIG. 2 (a) shows the initial condition where metal powder particles are scattered in the resin binder 60. FIG. 2 (b) shows the result of pressurizing the fine particle pattern using the driving body for pressure application 10. In the condition shown in FIG. 2 (b), metal powder particles are arranged in an orderly manner on the surface, without any gap left in between. A desirable condition is where metal powder particles 70 are arranged in an orderly manner on the surface, without any gap left in between, only in a single row.

One condition for any resin binder that can be used in the present invention is that the binder must have sufficient viscous elasticity to form a pattern via printing or under the dispensing method or inkjet method, while another condition is that the binder must have the same characteristics as the viscous substance. However, the sample installation table whose surface on which a film substrate is placed is made by a flat plate, is temperature-measured using a resistivity temperature gauge and the detected temperature is controlled to an arbitrary preset temperature. This way, evaporation of binder in the conductive paste is controlled.

Also, the conductive pattern forming apparatus supplies electrical current between the driving body for pressure application and the pattern (such as conductive paste formed into a pattern) and measures the resistivity of the pattern in the pressure application process. This way, the final resistivity of the pattern is controlled to a desired value.

Also, the conductive pattern forming apparatus locally heats, via supply of electrical current, the space between the driving body for pressure application and the pattern (such as conductive paste formed into a pattern). This way, evaporation of binder in the conductive paste is controlled.

Figure 3:
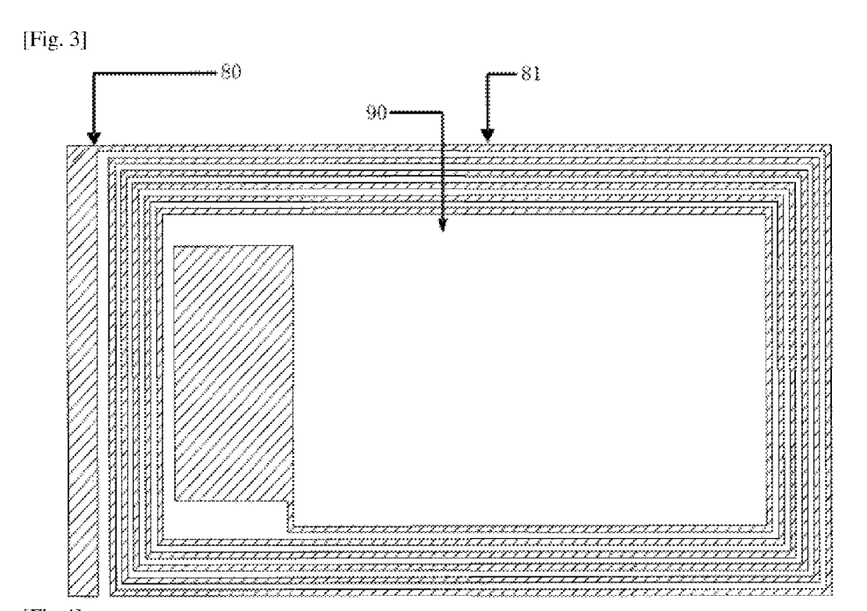
FIG. 3 Wiring diagram of a 13.56-MHz, RF-ID antenna.
Figure 4:
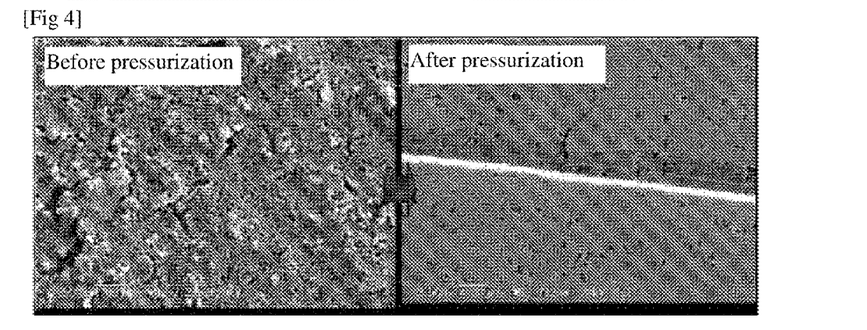
FIG. 4 Scanning electron microscope images of the surfaces of antenna wiring patterns before and after pressurization.
Figure 5:
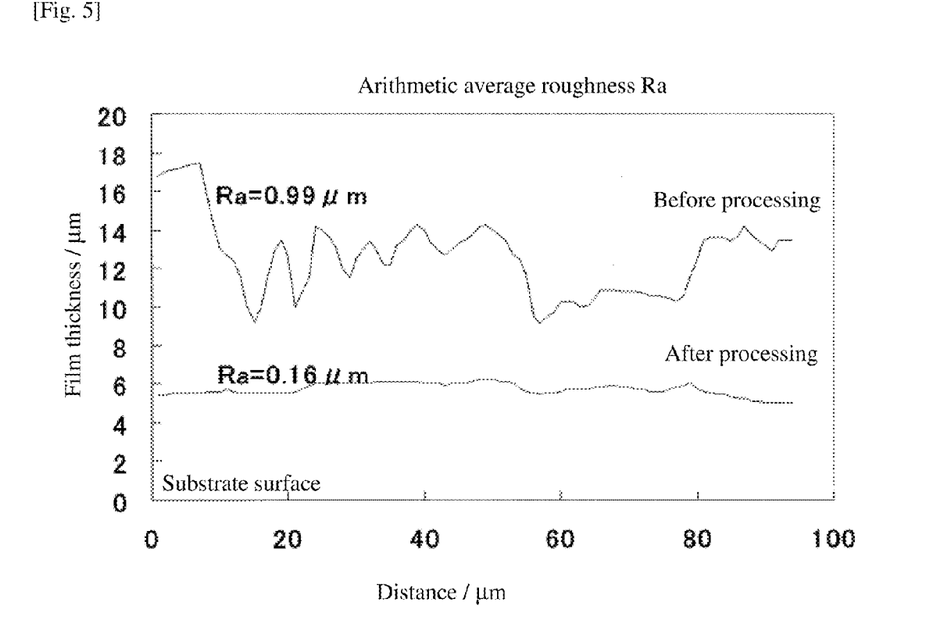
FIG. 5 Arithmetic average roughness Ra of a pattern conforming to the present invention.

A screen mask was installed on a screen printer and antenna wiring patterns 81 were formed by silver ink for screen printing 80 on an antenna substrate 90 (polyarylate liquid crystal polymer substrate), as shown in FIG. 3, after which the wiring patterns were let stand for 1 hour at approx. 100° C. on the sample installation table 30 to evaporate the organic solvent components in the silver ink for screen printing 80. Thereafter, the antenna wiring patterns 81 were sandwiched between the driving body for pressure application 10 and the sample installation table 30. In this condition, the driving body for pressure application 10 was moved in parallel along the substrate surface so that the metal spheres 20 pressed against, and thereby made sliding contact with, the entire surface of the antenna wiring patterns 81 as the driving body for pressure application 10 was swept in the front/rear and left/right directions along the surface in parallel with the flat surface of the sample installation table 30 so that the antenna wiring patterns 81 were uniformly pressurized. FIG. 4 shows scanning electron microscope images of the surface of antenna wiring patterns 81 before and after the pressurization, while FIG. 2 shows section views of antenna wiring patterns 81. FIG. 5 shows the arithmetic average roughness Ra obtained from the sweep measurement of surface shape over 100 μm using the probe method according to the patterns conforming to the present invention. The vertical axis represents the irregularity in μm in the direction of film thickness, while the horizontal axis represents the sweep distance of the observation probe in μm. The characteristic curve Ra=0.99 μm indicates the characteristics before the processing, where the trend of change in distance relative to film thickness fluctuates. On the other hand, the characteristic curve Ra=0.16 μm indicates the characteristics after the processing, where the trend of change in distance relative to film thickness improves and remains almost constant.

Figure 6:
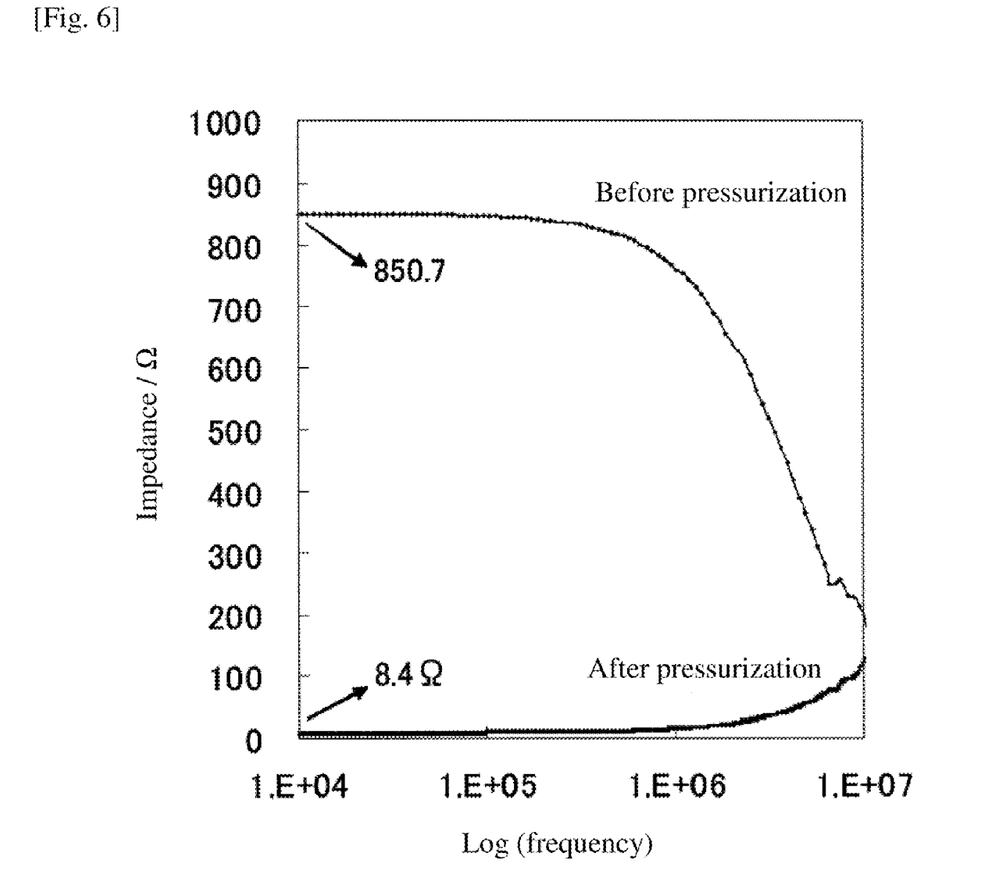
FIG. 6 Impedance vs. frequency characteristics of antenna wiring patterns before and after pressurization.

In the image shown in FIG. 4(a) taken before the pressurization, the antenna wiring patterns are porous and low density is observed. In the image shown in FIG. 4(b) taken after the pressurization, on the other hand, voids are virtually nonexistent and the density of fine metal particles is high. Frequency characteristics of impedance were measured for the same antenna wiring patterns. A precision impedance analyzer (4294A) by Agilent was used as the measurement system. FIG. 6 shows the impedance characteristics of antenna wiring patterns before and after the pressurization. While the impedance before the pressurization was 850.7Ω at a logarithm frequency of $10^4$ (Hz), the impedance after the pressurization was 8.4Ω, indicating that the pressurization was effective in reducing the impedance. Next, the Q-value was calculated to evaluate the antenna characteristics.

The Q-value is defined as follow:

$$Q = \frac{f_0}{f_2 - f_1} \qquad \text{[Formula 1]}$$

Figure 7:
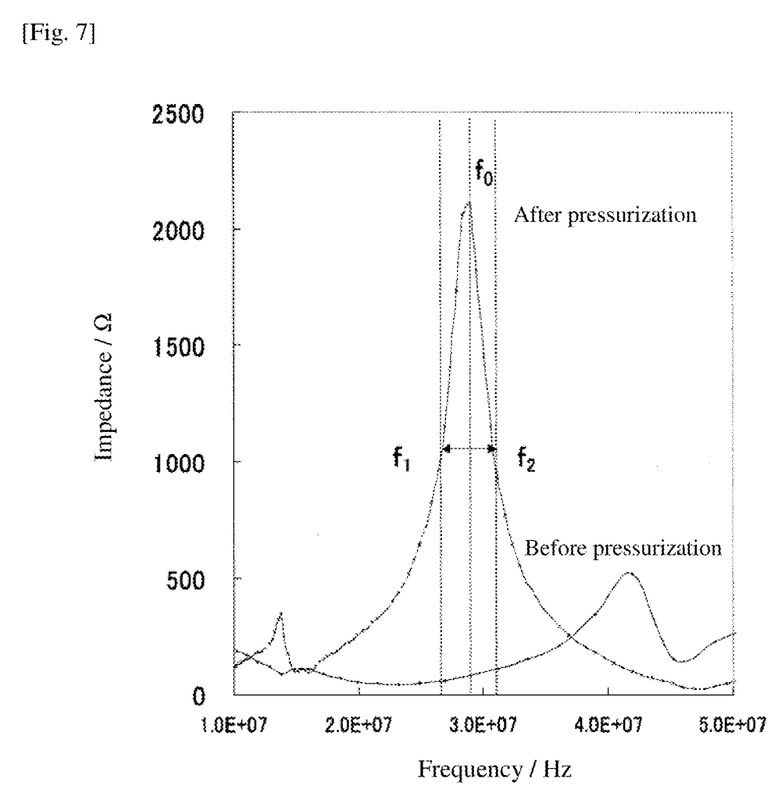
FIG. 7 Characteristics near the resonance frequency with respect to antenna wiring patterns before and after pressurization.

When the resonance frequency of the antenna was given as $f_0$, half value on the low frequency side as $f_1$, and half value on the high frequency side as $f_2$, the Q-value calculated from the frequency characteristics of impedance measured for the antenna after the pressurization was 6.9, based on the impedance characteristics near the resonance frequency as shown in FIG. 7, and the calculated Q-value was greater than the Q-value (5.6) of a commercially available RF-ID antenna made by etching metal aluminum. As for the antenna before the pressurization, no peak indicating resonance was observed in the frequency characteristics of impedance, and therefore the Q-value could not be calculated. These results suggest that a printed antenna of high quality can be produced by means of pressurization.

Similar results were also obtained with polyimide substrates and polyethylene terephthalate substrates instead of the antenna substrate 90 used in Example 1.

Example 2

Figure 8:
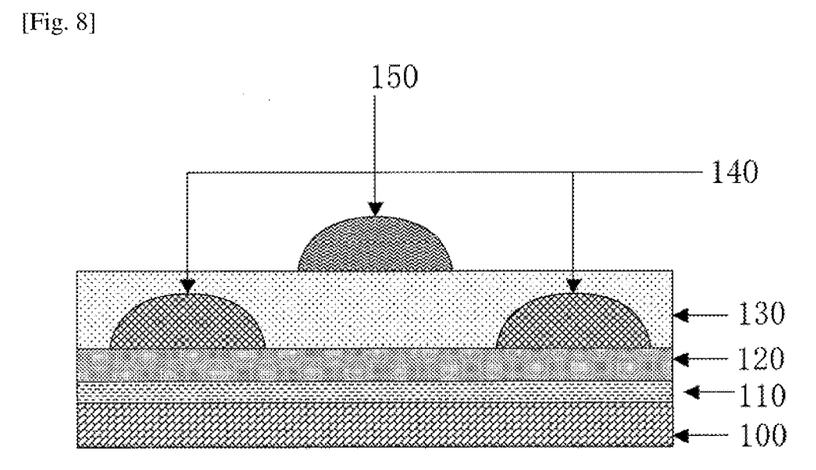
FIG. 8 Section view of a coated electric field effect transistor (FET) formed with zinc oxide (ZnO) using an apparatus conforming to the present invention.

As shown in FIG. 8, a screen mask was installed on a screen printer on an electric field effect transistor substrate 100 (polyarylate liquid crystal polymer substrate), and a paste being 20 wt % aqueous solution of polyvinyl alcohol (PVA) was coated to form a PVA adhesion layer 110. While moisture still remained in the PVA adhesion layer 110 and viscosity was retained, zinc oxide semiconductor powder ZnO having a particle size of 200 mesh or lower was adsorbed onto the PVA adhesion layer 110, after which it was let stand for 1 hour at approx. 100° C. on the sample installation table 30 to evaporate the moisture remaining in the PVA adhesion layer 110 and fix the ZnO powder, thereby forming a ZnO layer 120. Thereafter, the entire part from the substrate 100 through the ZnO layer 120 was sandwiched between the driving body for pressure application 10 and the sample installation table 30. At this time, the driving body for pressure application 10 was swept in the front/rear and left/right directions horizontally with the flat surface of the sample installation table 30 so that the metal spheres 20 of the driving body for pressure application 10 would uniformly press against, and thereby make sliding contact with, the entire surface of the ZnO layer 120. Drain-source electrodes 140 were coated on this ZnO layer 120 using Ag paste.

Figure 9:
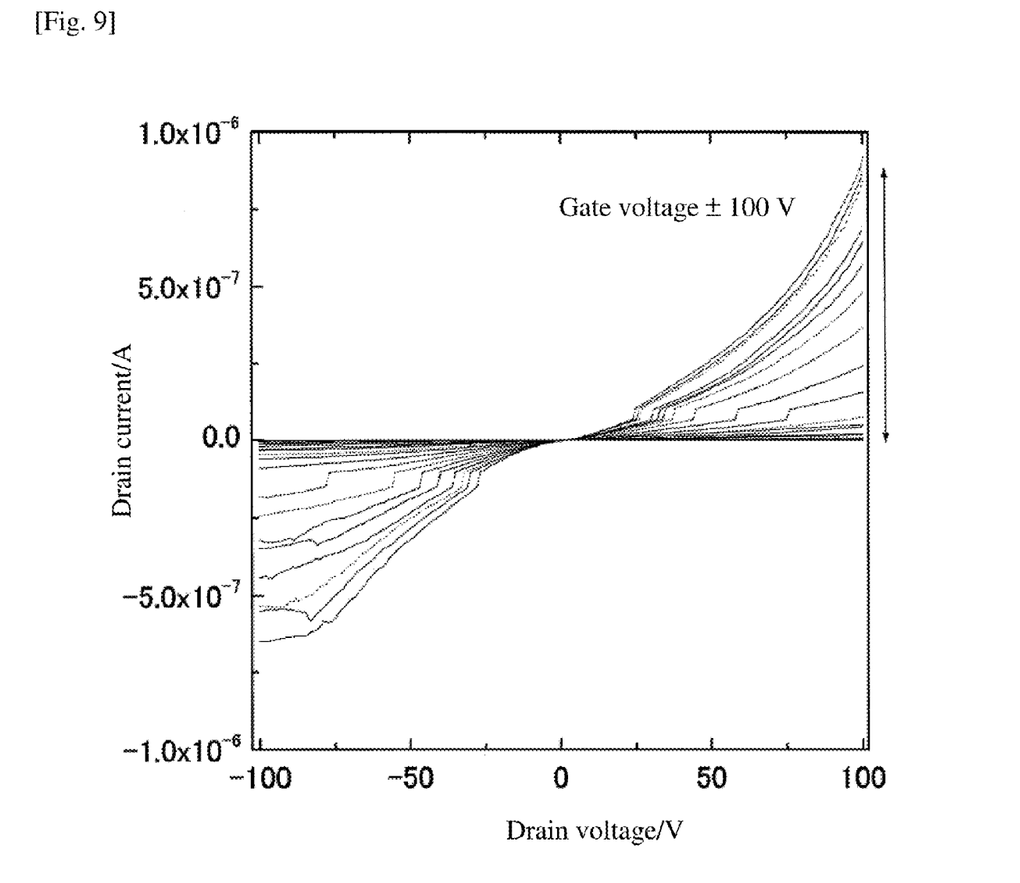
FIG. 9 Output characteristics of a coated FET formed at a gate voltage of ±100 V using an apparatus conforming to the present invention.
Figure 10:
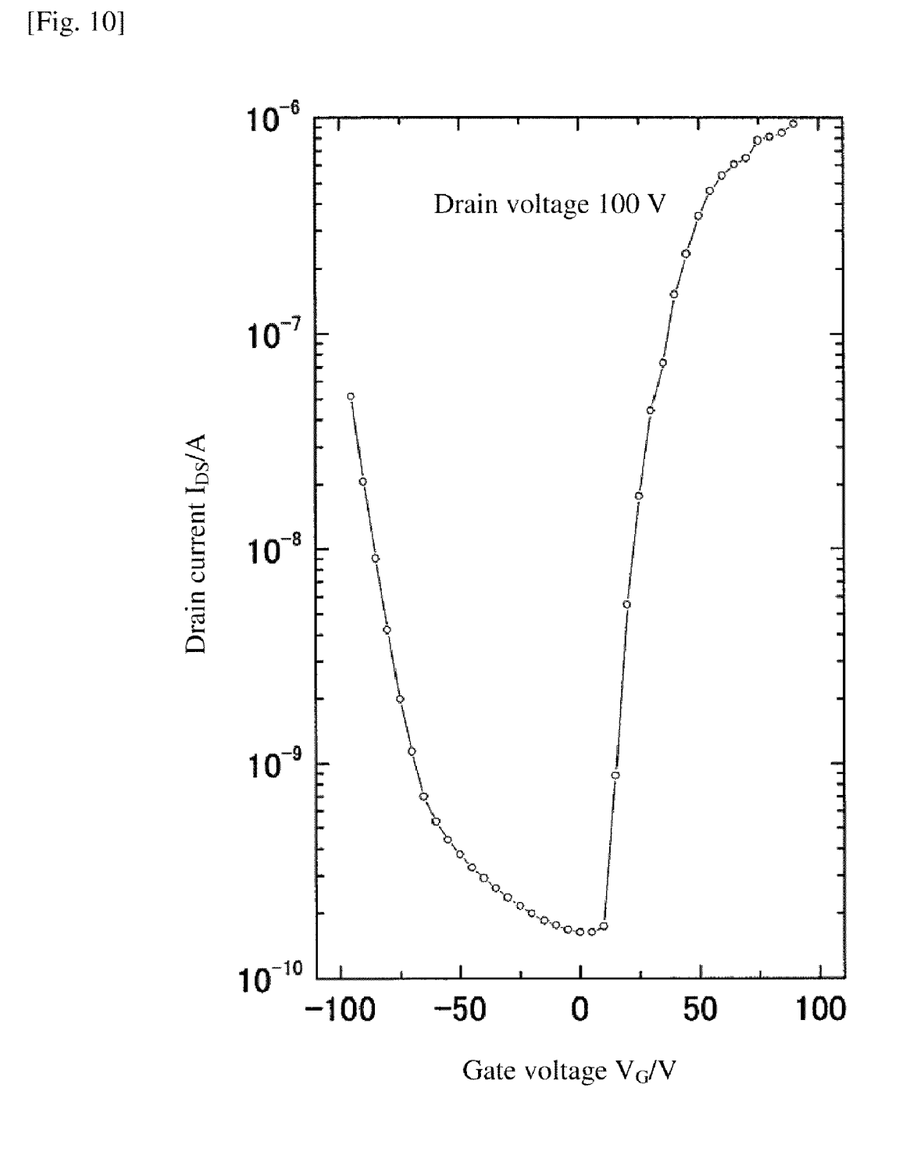
FIG. 10 Transmission characteristics of a coated FET formed at a drain voltage of 100 V using an apparatus conforming to the present invention.

In this case, the channel width was 5,000 μm, while the channel length was 1,000 μm. A gate insulation film 130 was coated on top using 10 wt % PVA aqueous solution, and finally a gate electrode 150 was coated using Ag paste, to form a coated electric field effect transistor. A measurement system interlocked with the 2400 source meter by Keithley used as the gate voltage source and the 6430 femtoampere meter by Keithley used as the drain-source voltage source and ammeter, is connected to a vacuum prober to measure the transistor characteristics. As shown in FIG. 9, gate voltage modulation relative to drain current was observed, and from the transmission characteristics shown in FIG. 10, it was shown that this electric field effect transistor would function as a typical N-type electric field effect transistor. When an electric field effect transistor was formed in the same manner using the ZnO layer 120 before the pressurization, the obtained electric field effect transistor did not operate at all. This indicates that the ZnO layer 120 would start functioning as a N-type semiconductor only as a result of density increase caused by the pressurization.

Similar results were also obtained with polyimide substrates and polyethylene terephthalate substrates instead of the electric field effect transistor substrate 100 used in Example 2. In addition, similar transistor characteristics were also achieved using other semiconductor layers, such as $In_2O_3$, NiO and $SnO_2$, instead of the ZnO layer 120 used in Example 2. When the work function was measured for these semiconductor films using a vibration-capacitance type work function measuring equipment (FAC-1 by Riken Keiki), the measured work functions were 4.2 eV, 4.7 eV and 4.9 eV for $In_2O_3$, NiO and $SnO_2$, respectively. It was also indicated that when these semiconductors were mixed in powder form and then the powder mixtures were used to form semiconductor films, the work functions of obtained semiconductor films could be adjusted.

Example 3

A printed silver wiring with a wire width of 1 mm, film thickness of approx. 12 μm and overall length of 100 mm was formed on a PET substrate using a screen printer and silver paste for screen printing. A micrometer (MDC-25MJ by Mitutoyo) was used in the measurement of film thickness. When this silver wiring was heated and pressurized using a roller press equipped with an infrared heating mechanism, the film thickness decreased to approx. 6 μm and metal gloss was observed on the surface. Although the roller temperature rose to 80° C. at this time as a result of heating by infrared light, the sample table remained at normal temperature. When the pressure distribution was measured at the time of pressurization using a pressure measurement sheet (Prescale (registered trademark) for medium pressure and high pressure by Fuji Photo Film), the measured pressures were within a range of 10 MPa to 100 MPa. Change in wiring dimension caused by heating and pressurization, other than change in film thickness, was within 1%. Dimensional change of the PET substrate before and after the heating and pressurization was also within 1%.

Figure 11:
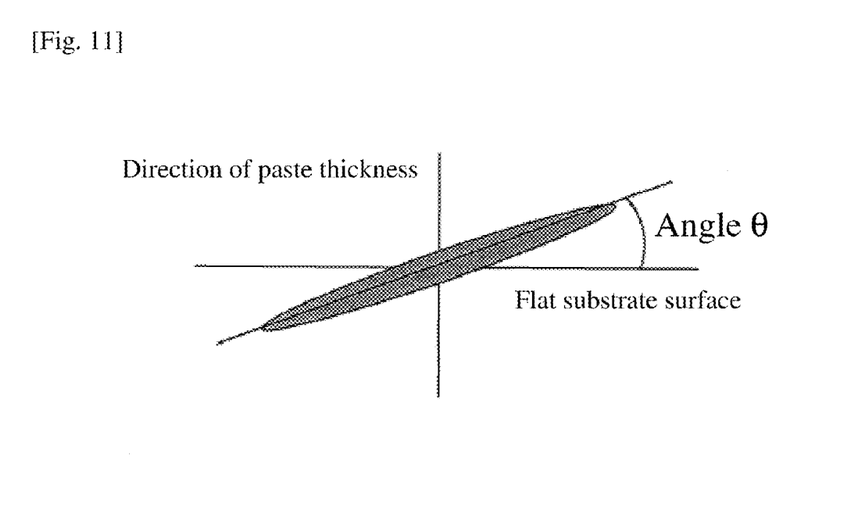
FIG. 11 Drawing explaining the degree of orientation under the present invention.
Figure 12:
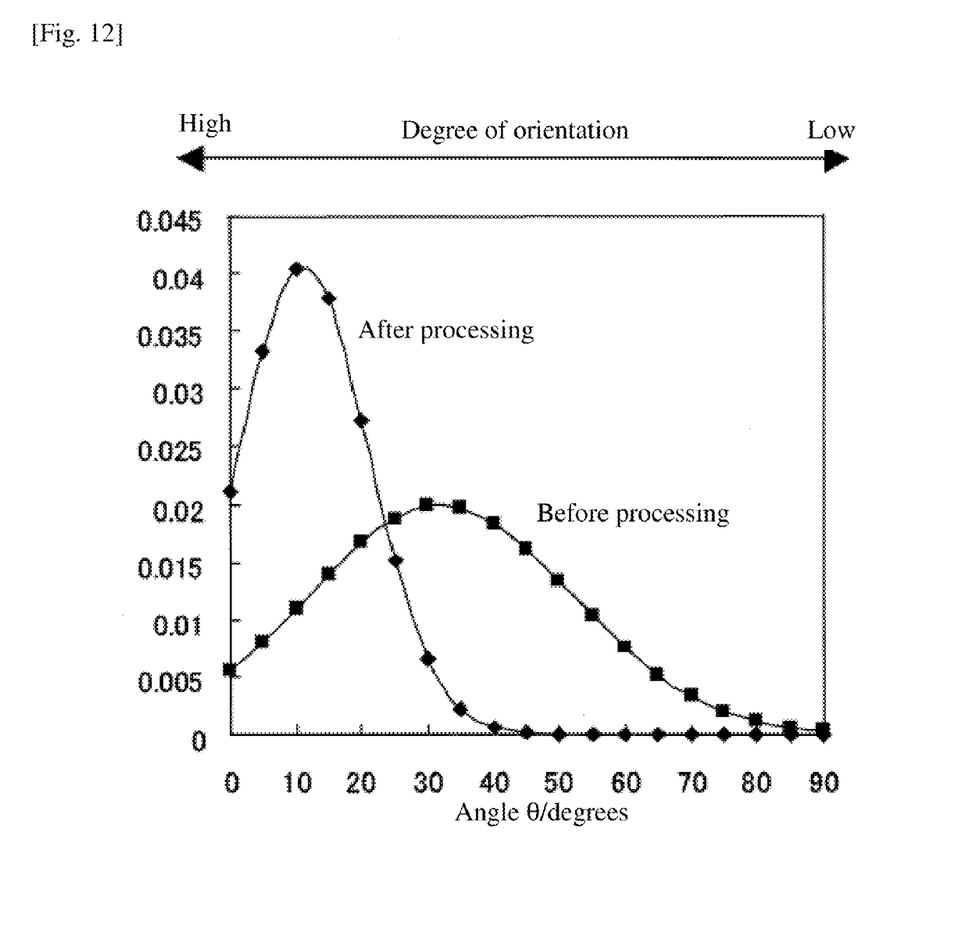
FIG. 12 Characteristics of degree of orientation under the present invention.

When the electrical resistivity was measured using a digital multi-meter (PC500 by Sanwa Electric Instrument) and the final resistivity was calculated from the wiring dimensions, the obtained resistivity was $6.0 \times 10^{-6}$ Ω·cm. Based on the section view of metal wiring, the distribution of the orientation angle, which is defined as the angle formed by the long axis of the ellipsoidal body with the axis horizontal to the flat substrate surface, according to FIG. 11, was obtained. The result is shown in FIG. 12. As you can see, the average orientation angle was approx. 35 degrees while the width was approx. 23 degrees before the processing (oriented pressurization), indicating an isotropic distribution. After the processing according to the present invention (oriented pressurization), on the other hand, the average orientation angle became approx. 12 degrees while the width became approx. 10 degrees, suggesting a structure of a high orientation of the long axis in the direction parallel with the film surface. This confirms that sufficient orientation effect was achieved as a result of pressurization.

Figure 13:
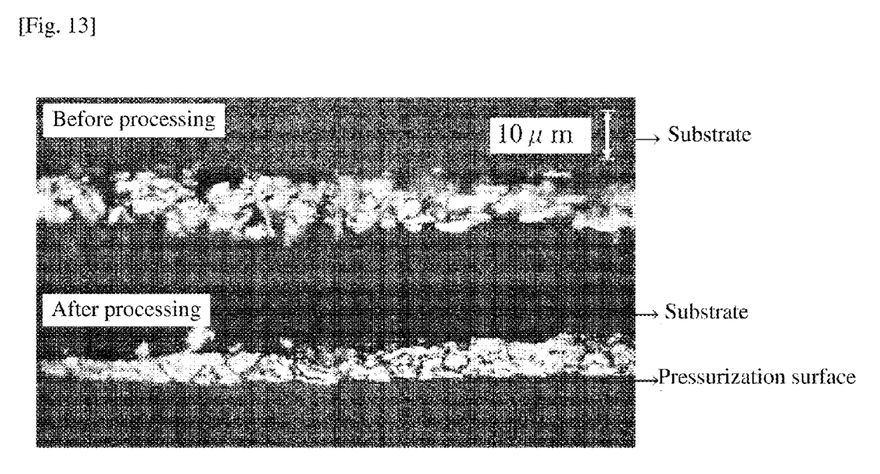
FIG. 13 Optical microscope images showing section views of a conductive paste conforming to the present invention.

Also based on FIG. 13, which shows section views of the conductor pattern formed on the substrate, the density of fine particles in the conductor pattern was evaluated before and after the processing (oriented pressurization). As a result, the density of fine particles in the conductor pattern near the interface with the substrate became approx. one half the density of fine particles in the paste near the interface opposite the substrate. This suggests that the binder content was higher near the substrate interface.

In FIG. 13, the top image is a section view of the substrate and conductive pattern before the processing (oriented pressurization), while the bottom image is a section view of the substrate and conductive pattern after the processing (oriented pressurization).

For your information, the above evaluation was performed based on the filling ratio of filler, which was obtained by the area division method according to the section images in FIG. 13.

Example 4

A blade was attached to a blade coater and the interval between the blade and substrate was set to 8 µm, a level smaller than the film thickness of printed wiring, and then the blade was traveled over the printed wiring, which was formed in a manner similar to Example 3, to implement heating and pressurization at 80° C. At this time, the PET substrate was affixed on the sample table of the blade coater. As a result of heating and pressurization, the film thickness decreased to approx. 8 µm, and metal gloss was observed on the surface. When the electrical resistivity was measured using a digital multi-meter, the measured resistivity was $1.5 \times 10^{-5}$ Ω·cm.

Example 5

Non-crystalline polyester resin soluble in organic solvent was dissolved in a solvent constituted by methyl ethyl ketone and toluene mixed at a ratio of 1:1, in such a way that the weight concentration became 30 wt %, after which the obtained mixture was used as a binder resin and then aluminum powder whose long axis and short axis had different lengths was surface-washed and mixed into this binder resin to 30 wt %, in order to obtain an aluminum paste. Fine spherical zinc particles were dispersed in this aluminum paste to a weight concentration of 10 wt % relative to the binder resin.

This aluminum paste was coated on a PET substrate with a thickness of 50 µm, using the blade coating method, after which the coated substrate was heated for 30 minutes at 100° C. to volatilize the solvent component, to form a square aluminum patch of 1 cm×1 cm in size and approx. 100 µm in thickness. When the electrical resistivity was measured using a digital multi-meter (PC500 by Sanwa Electrical Instrument), the sheet resistivity was approx. 1 MΩ/□. When pressurization orientation was implemented over this aluminum patch using a roller press and then the electrical resistivity was measured, the obtained sheet resistivity was approx. 20Ω/□. When the work function was measured on the patch surface using a vibration-capacitance type work function measuring equipment (FAC-1 by Riken Keiki), the obtained work function was 4.5 eV.

Example 6

Aluminum powder whose long axis and short axis had different lengths, prepared in a manner similar to the above, was dispersed in a non-crystalline polyester binder resin to 30 percent by weight relative to the resin, to prepare an aluminum paste. This aluminum paste was coated on a PET substrate with a thickness of 50 µm, using the blade coating method, after which the coated substrate was heated for 30 minutes at 100° C. to volatilize the solvent component, to form a square aluminum patch of 1 cm×1 cm in size and approx. 100 µm in thickness. When the electrical resistivity was measured using a digital multi-meter (PC500 by Sanwa Electrical Instrument), measurement was not possible (the resistivity was 40 MΩ or above). A stainless mesh (635 mesh) was sandwiched at the rollers of the roller press and then this roller press was used to implement pressurization orientation over the aluminum patch. When the electrical resistivity was measured, the sheet resistivity was approx. 1 MΩ/□. When the work function was measured on the patch surface using a vibration-capacitance type work function measuring equipment (FAC-1 by Riken Keiki), the obtained work function was 4.4 eV. Similar effects were obtained even when the stainless mesh was changed to one of 200 mesh.

Example 7

Square adhesive patches of 1 cm×1 cm in size were prepared using a screen press and insulation paste for screen printing (manufactured by Namics). The patches were kept in a manner protected from drying to maintain its adhesiveness, and in this condition the patches were placed in a sealed container and then silver particles (nano-powder of 99.5% in purity and 100 nm or less in average particle size, manufactured by Aldrich) or gold particles (nano-powder of 99.9% in purity and 50 to 130 nm in average particle size, manufactured by Aldrich) were adsorbed onto the adhesive patches. Any particles adsorbed onto those other than the patches were removed using a blower. Then, the patches to which metal particles had been adsorbed were heated for 30 minutes at 150° C. to harden the patches and fix the metal particles. In this condition, the patch to which gold particles had been adsorbed appeared brown, while the patch to which silver particles had been adsorbed appeared gray, where no metal gloss was observed on both. When the sheet resistivity of patches were measured using a digital multi-meter, measurement was not possible (40 MΩ/□ or above). These patches to which fine metal particles had been adsorbed were pressurized using a roller press. As a result, the patches exhibited metal gloss of gold color and silver color, respectively, and the sheet resistivity became 0.01Ω/□ or below (measurement lower limit) on both the gold and silver patches. The film thickness of thin metal film alone could not be measured.

When the work function was measured on the patch surface using a vibration-capacitance type work function measuring equipment (FAC-1 by Riken Keiki), the measured work function was 4.8 eV for the gold patch and 4.6 eV for the silver patch, both of which were similar to the values in a bulk state.

What is claimed is:

1. A conductive pattern-formed film comprising a conductive pattern formed on a film substrate having flexibility,
    said conductive pattern comprising conductive fine particles and a viscous substance and being patterned by applying on the film substrate in a pattern and pressurizing, under heating, a material constituted by the conductive fine particles dispersed and filled in the viscous substance,
    said conductive pattern having a lower portion near a lower surface of the conductive pattern, which lower surface contacts the film substrate, and an upper portion near an upper surface of the conductive pattern opposite the lower surface, and having a density of the viscous substance changing in the conductive pattern in a direction perpendicular to a surface of the film substrate wherein the density of the viscous substance is higher in the lower portion than in the upper portion,
    said conductive pattern having a density of the fine particles changing in the conductive pattern in a direction perpendicular to the surface of the film substrate wherein the density of the fine particles is higher in the upper portion than in the lower portion.

2. The conductive pattern-formed film according to claim 1, characterized in that the conductive fine particles are fine metal or semiconductor particles.

3. The conductive pattern-formed film according to claim 1, characterized in that the conductive fine particles have a particle size in a range of 10 nm to 10 μm.

4. The conductive pattern-formed film according to claim 1, characterized in that the conductive fine particles are gathered or aggregated into a powder form, that the powder is such that the lengths of its long axis and short axis are different, where the long axis of each powder particle is oriented in parallel with the substrate surface and contacting the adjacent powder particles, and that the conductive fine particles that constitute the powder contain one or more materials selected from silver, gold, copper, and aluminum.

5. The conductive pattern-formed film according to claim 1, characterized in that the conductive fine particles contain one or more materials selected from silver, gold, copper and aluminum.

6. The conductive pattern-formed film according to claim 1, characterized in that the fine metal particles that constitute the conductive fine particles are aluminum in which additive particles are mixed, said additive particles being zinc particles.

7. The conductive pattern-formed film according to claim 4, characterized in that the powder is constituted by conductive fine particles, and fine metal particles that constitute the conductive fine particles are aluminum in which additive particles are mixed, said additive particles being zinc particles.

8. The conductive pattern-formed film according to claim 1, characterized in that fine semiconductor particles that constitute the conductive fine particles are any one or more materials selected from zinc oxide, indium oxide, titanium oxide, tin oxide, nickel oxide and compounds that contain any of the foregoing.

9. The conductive pattern-formed film according to claim 4, characterized in that the powder is constituted by conductive fine particles, and the conductive fine particles are any one or more materials selected from zinc oxide, indium oxide, titanium oxide, tin oxide, nickel oxide and compounds that contain any of the foregoing.

10. The conductive pattern-formed film according to claim 1, wherein the density change of the fine particles is generated by pressurizing the material patterned on the film substrate, under heat, in a direction perpendicular to the film surface, while exerting sliding stress on the material along a direction parallel to the film substrate, thereby migrating the conductive fine particles near the surface of the conductive pattern opposite the surface that contacts the film substrate.

* * * * *